(12) United States Patent
Pinter et al.

(10) Patent No.: US 8,699,115 B2
(45) Date of Patent: Apr. 15, 2014

(54) PRODUCTION METHOD FOR A MICROMECHANICAL COMPONENT, AND A MICROMECHANICAL COMPONENT

(75) Inventors: Stefan Pinter, Reutlingen (DE); Christoph Friese, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 1303 days.

(21) Appl. No.: 12/506,231

(22) Filed: Jul. 20, 2009

(65) Prior Publication Data

US 2010/0014147 A1    Jan. 21, 2010

(30) Foreign Application Priority Data

Jul. 18, 2008    (DE) .................. 10 2008 040 528

(51) Int. Cl.
G02B 26/00    (2006.01)
G02B 26/08    (2006.01)

(52) U.S. Cl.
CPC .................... *G02B 26/085* (2013.01)
USPC ....................................... 359/290

(58) Field of Classification Search
USPC .......... 359/220, 234–224, 237, 295, 290–292
See application file for complete search history.

(56) References Cited

U.S. PATENT DOCUMENTS 6,295,154 B1 *    9/2001    Laor et al. .................. 359/223.1

OTHER PUBLICATIONS

Nieradko L., Gorecki C., Jozwik M. Sabac A. Hoffman R. Bertz A. Fabrication and Optical packaging of an integrated Mach-Zehnder interometer on top of a mocable micromirror, Apr.-Jun. 2006, J. Microlith. Microfab. Microsyst. vol. 5(2), p. 023009-1-0023009-9.*

* cited by examiner

*Primary Examiner* — Scott J Sugarman
*Assistant Examiner* — Robert E Tallman
(74) *Attorney, Agent, or Firm* — Kenyon & Kenyon LLP

(57) ABSTRACT

A production method for a micromechanical component and a micromechanical component apparatus are provided encompassing the steps of: forming a housing having an incident light window, forming a multitude of optically active surfaces on a wafer, subdividing the wafer into a multitude of chips having at least one optically active surface in each case, which surface is designed in such a way that, at least in a deactivated operating mode of the chip, the optically active surface is situated in an initial position with respect to the chip, and affixing at least one of the chips inside the housing, the optically active surface of the chip in its initial position being aligned at an angle of inclination that is not equal to 0° and not equal to 180° with respect to the incident light window.

10 Claims, 7 Drawing Sheets

PRODUCTION METHOD FOR A MICROMECHANICAL COMPONENT, AND A MICROMECHANICAL COMPONENT

CROSS-REFERENCE TO RELATED APPLICATIONS

The present application claims priority to German Application No. 10 2008 040 528.0, filed in the Federal Republic of Germany on Jul. 18, 2008, which is expressly incorporated herein in its entirety by reference thereto.

FIELD OF THE INVENTION

The present invention relates to a production method for a micromechanical component and to a micromechanical component.

BACKGROUND INFORMATION

The mounting and use of an optical element, e.g., an optically active surface, in a micromechanical component poses special challenges to the packaging of the micromechanical component, which do not present themselves when a microelectrical and/or a purely micromechanical element is used in the micromechanical component. Microelectrical and/or purely micromechanical elements such as sensors or mechanical actuators, for example, usually have only electrical interfaces. This simplifies a complete encapsulation of the microelectrical and/or purely micromechanical elements at the wafer level. The encapsulation can take place in a clean or super-clean environment. In addition, the complete encapsulation of a microelectronic and/or purely micromechanical element at the wafer level is able to be implemented in a relatively cost-effective manner because processes run in parallel. Following the encapsulation, the microelectronic and/or purely micromechanical elements can be separated, cleaned and/or processed further in a normal, clean environment. For instance, an installation inside a chip housing, the development of an electrical contacting and/or an insertion into a system take(s) place.

The use of an optical element in a micromechanical component inside a protective housing usually requires optical radiation to be coupled in and/or out. The incoupling and/or decoupling of optical radiation frequently takes place via an incident light window made of a light-transmitting material having a refractive index not equal to 1. For example, such an incident light window is formed in the encapsulation of an active surface from at least one glass wafer, since glass wafers have suitable optical properties such as transparency, roughness and planarity. An encapsulation of the optical element with the aid of a glass wafer is possible at a wafer level as well.

FIG. 1 shows a schematic illustration of a first conventional micromechanical component having an optically active surface. Conventional micromechanical component 10 has a reflective surface of a reflective plate 12 as optically active area. To protect against environmental effects, reflective plate 12 is situated inside a housing formed by a frame part 14, an upper cover 16, and a lower cover 18. Upper cover 16 is at least partially made of a light-transmitting material. The housing formed by components 14 through 18 may have an airtight design, for instance.

Reflective plate 12 is joined to the housing formed by components 14 through 18 via at least one spring element 20. Via an electrostatic and/or magnetic drive, reflective plate 12 is able to be rotated about an axis of rotation running along the longitudinal axis of spring element 20. Dashed lines 12a show possible positions of reflective plate 12 with respect to covers 16 and 18.

A beam of light 22 incident on the boundary surfaces of upper cover 16 is partially reflected. The transmitted component of incident beam of light 22 strikes reflective plate 12, which directs it as a deflected beam of light 24 to an image plane 26. Depending on the position of reflective plate 12, deflected beam of light 24 strikes various points of image plane 26. Beam of light 28 reflected at the boundary surfaces of upper cover 16 may at least partially also strike image plane 26 and thus lead to an interference reflex on image plane 26. If upper cover 16 has a large reflection coefficient for the angle of incidence of incident beam of light 22, then the interference reflex may have a relatively high light intensity. The interference reflex, unlike beam of light 24 deflected by reflective plate 12, is not variable in its location.

One may—for preventing interference reflexes—dispense with the use of a housing which completely surrounds reflective plate 12. In this case, however, a reflective plate 12 is no longer protected from environmental influences. In addition, a reflective plate 12 not protected by a housing is often more difficult to separate and/or able to be installed in a device only with more difficulty. More specifically, in such a case it is frequently impossible to utilize standard processes for the separation or the installation.

FIG. 2 shows a schematic illustration of a second conventional micromechanical component having an optically active surface.

Illustrated micromechanical component 30 includes the already described components 12, 14, 18, and 20. In addition, micromechanical component 30 has an upper glass cover 32 made up of a glass cover plate 34 and a side plate 36. Glass cover plate 34 on which an incident beam of light 22 impinges is aligned at an angle with respect to a center position of reflective plate 12. Beam of light 28 reflected at the boundary surfaces of cover plate 34 is therefore not deflected to image plane 26 of reflective plate 12. This prevents interference reflexes at image plane 26.

However, upper glass cover 32 is difficult to realize at the wafer level. Producing a glass wafer having sloped surfaces is relatively work-intensive and thus relatively expensive. Especially the polishing of the sloped surfaces is frequently not able to be accomplished in satisfactory manner, so that the sloped surfaces have high transparency and very low roughness.

SUMMARY

Embodiments of the present invention provide a production method for a micromechanical component, including: forming a housing (100, 108, 116) having an incident light window (108); forming a multitude of optically active surfaces (50) on a wafer (52); subdividing the wafer (52) into a multitude of chips (80) having at least one optically active surface (50) in each case, which is designed in such a way that at least in a deactivated operating mode of the chip (80), the optically active surface (50) is disposed in an initial position with respect to the chip (80); and mounting at least one of the chips (80) in the housing (100, 108, 116), the optically active surface (50) of the chip (80) in its initial position being aligned with respect to the incident light window (108) at an angle of inclination that is not equal to 0° and not equal to 180°.

Embodiments of the present invention provide a micromechanical component including: a chip (80) including an optically active surface (50), which at least in a deactivated operating mode of the chip (80) is situated in an initial position with respect to the chip (80); and a housing (100, 108, 116), which completely surrounds the chip (80) and has an incident light window (108); the chip (80) being affixed inside the housing (100, 108, 116) in such a way that the optically active surface (50) in its initial position has an inclined alignment with respect to the incident light window (108), the angle of inclination being not equal to 0° and not equal to 180°.

Embodiments of the present invention provide for a realization that the conventional requirement of an encapsulation at the wafer level, which is difficult to accomplish, is unnecessary when the incident light window for coupling a beam of light in and/or out is formed at the level of the chip housing. Thus, for example, subsequently or prior to developing the incident light window, the chip is affixed inside the chip housing in such a way that the incident light window is tiled with respect to the optically active surface of the chip by an angle of inclination not equal to 0° and not equal to 180°. The occurrence of an interference reflex is thus able to be prevented in an uncomplicated manner.

In embodiments of the present invention, the production of components of the housing may be implemented by injection molding (premold). This enables a cost-effective production of housing components in high piece numbers. The mounting of the incident light window may be implemented by a separate step.

Embodiments of the present invention provide a cost-effective production of a housing by packaging technology using standardized machinery. Although a wafer-level encapsulation, which requires expensive and complicated production steps, is dispensed with, sawing and packaging is possible nevertheless, the active surfaces being protected.

In embodiments of the present invention, the optically active surface is formed in recessed manner with respect to an equidirectional front side of the wafer. This ensures additional protection for the optically active surface during the production process.

In embodiments of the present invention, prior to subdividing the wafer, a cover wafer is fixed in place on a rear side of the wafer oriented counter to the optically active surface, the cover wafer being subdivided into a multitude of protective covers, so that each chip is provided with a protective cover. For example, the chips furnished with the protective cover and having at least one active surface may be held under normal, clean environmental conditions using standard systems (handling), transported, and/or installed in the housing.

In addition, for example, prior to subdividing the wafers the front side of the wafer, which has the same orientation as the optically active surface, may be covered by a sawing foil. Temporary capping of the optically active surface by the sawing foil facilitates the separation of the optically active surfaces formed on the wafer in high numbers.

In embodiments of the present invention, a first adjustment element may be developed on an outer side of the housing, and a precisely fitting second adjustment element may be developed on a mounting board, the first adjustment element and the second adjustment element being brought into contact with each other in such a way that they establish a mechanical connection between the housing and the mounting board. This facilitates the placement of the housing in a preferred position on the mounting board. In addition, for example, using the self-adjusting structures and/or self-adjusting cut-outs, it is possible to minimize the tolerances that occur in the alignment of the housing on the mounting board.

The advantages described in the paragraphs above are also ensured for a corresponding micromechanical component.

In embodiments of the present invention, the housing includes a wall having a continuous opening, and the incident light window is situated on a first contact surface of the wall in such a way that the incident light window covers the opening at least partially, the chip being disposed on a second contact surface of the wall, and the second contact surface being aligned with respect to the first contact surface at an angle of inclination that is not equal to 0° and not equal to 180°. This can enable a cost-effective implementation of the present invention.

In embodiments of the present invention, the housing has a first adjustment element, and the chip has a precisely fitting second adjustment element, and the chip is affixed inside the housing in such a way that the two adjustment elements form a mechanical connection between the chip and the housing. For example, the first adjustment element and/or the second adjustment element may include a conical, semispherical and/or pyramid-shaped projection, the first adjustment element and/or the second adjustment element including a cut-out that is a precise fit with the conical, semispherical and/or pyramid-shaped projection. This ensures a minimum of deviations in the adjustment of the chip inside the housing.

The advantages described in the above paragraphs are also achieved in a corresponding production method.

Additional features and advantages of the present invention are elucidated in greater detail below, with reference to the drawings.

DETAILED DESCRIPTION

Figure 1:
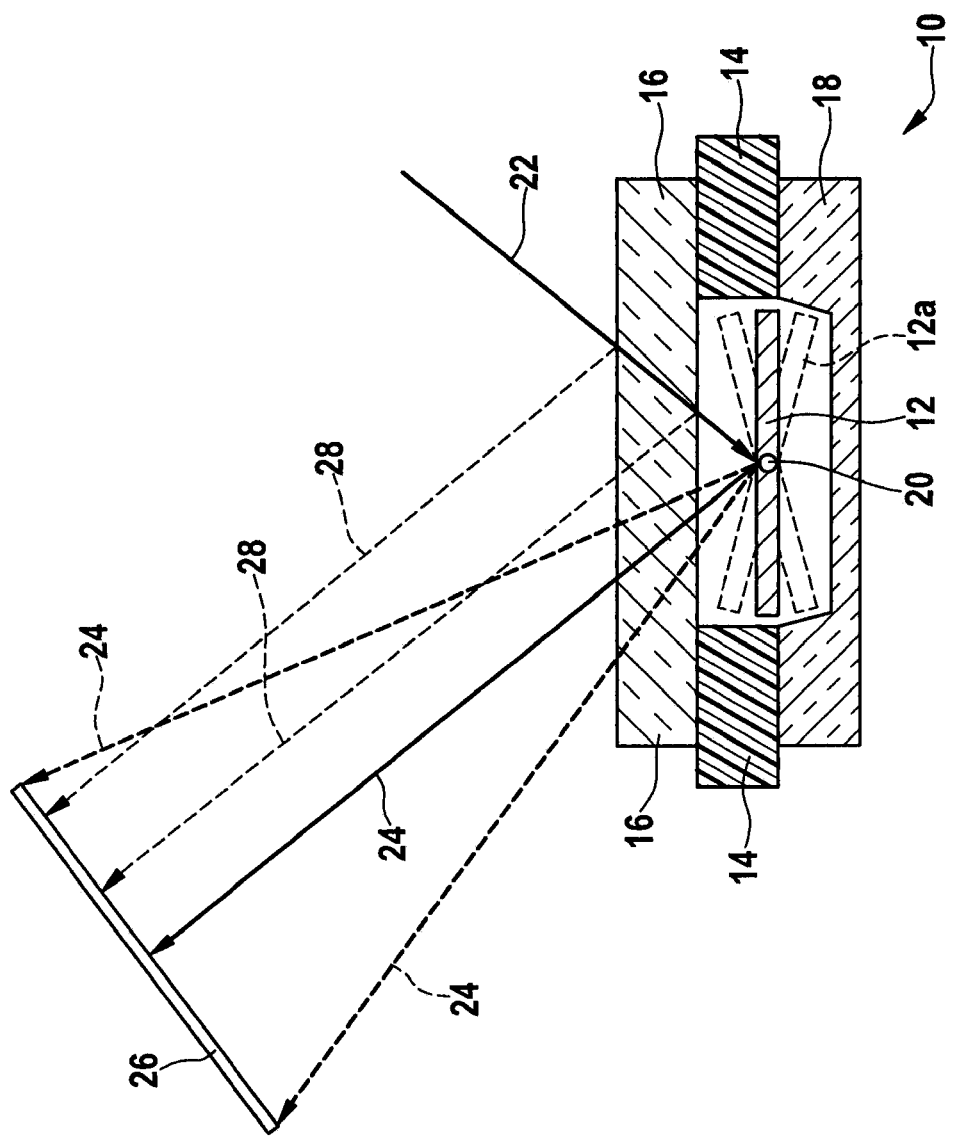
FIG. 1 shows a schematic illustration of a first conventional micromechanical component having an optically active surface.
Figure 2:
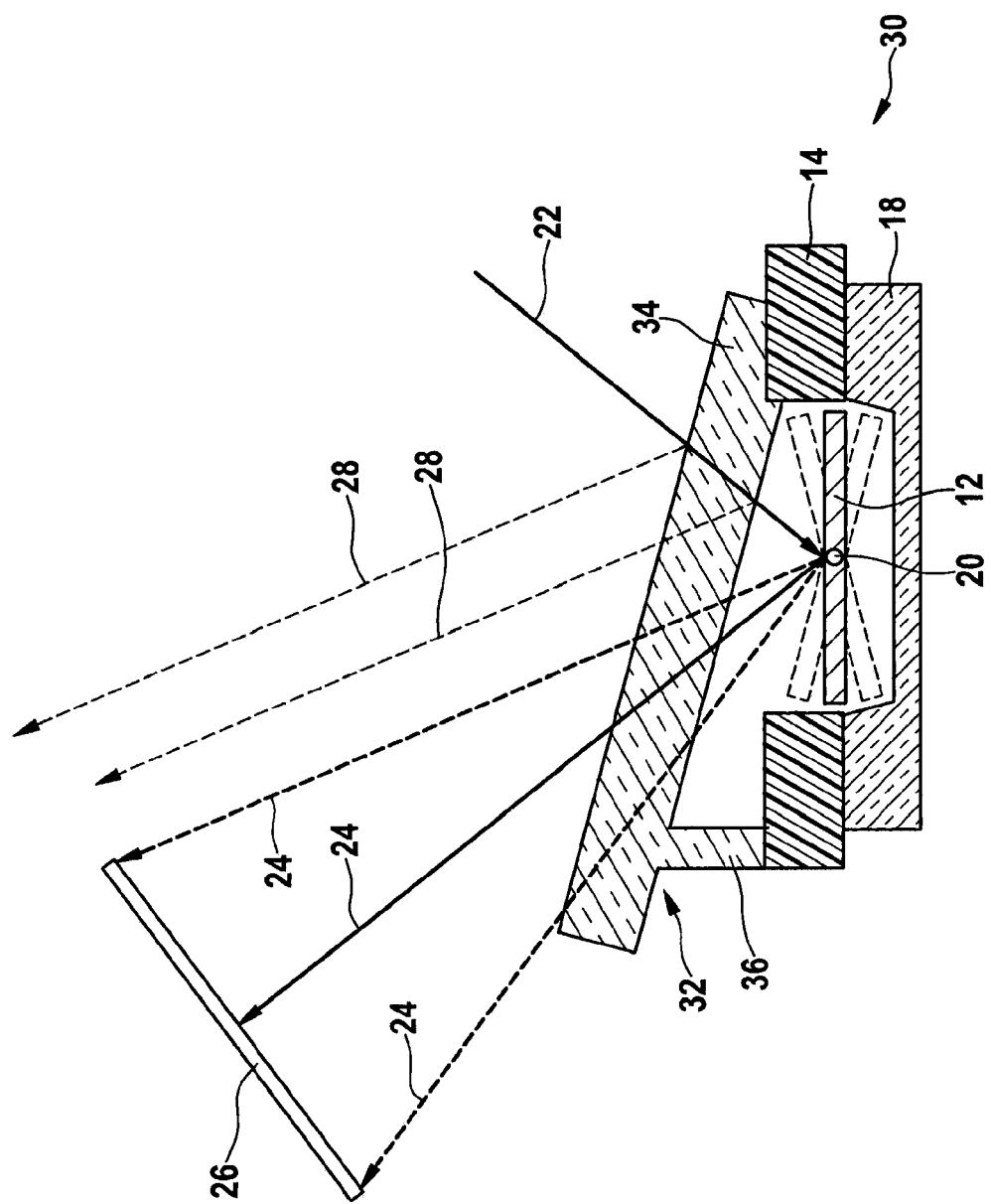
FIG. 2 shows a schematic illustration of a second conventional micromechanical component having an optically active surface.
Figure 3A:
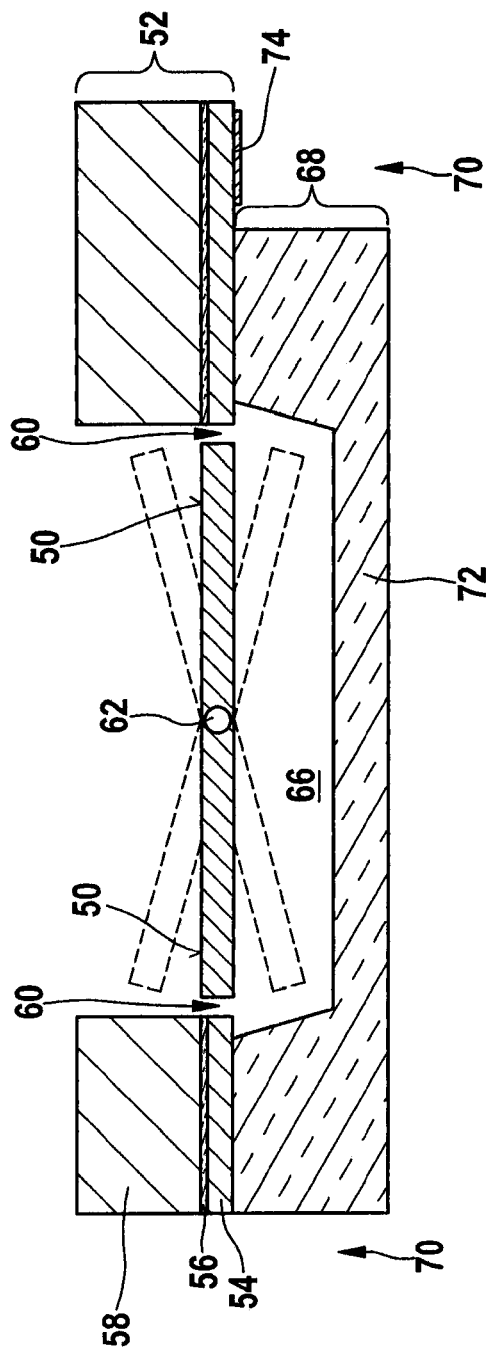
FIG. 3A shows a schematic illustration of a wafer to illustrate a first specific embodiment of the production method.
Figure 3B:
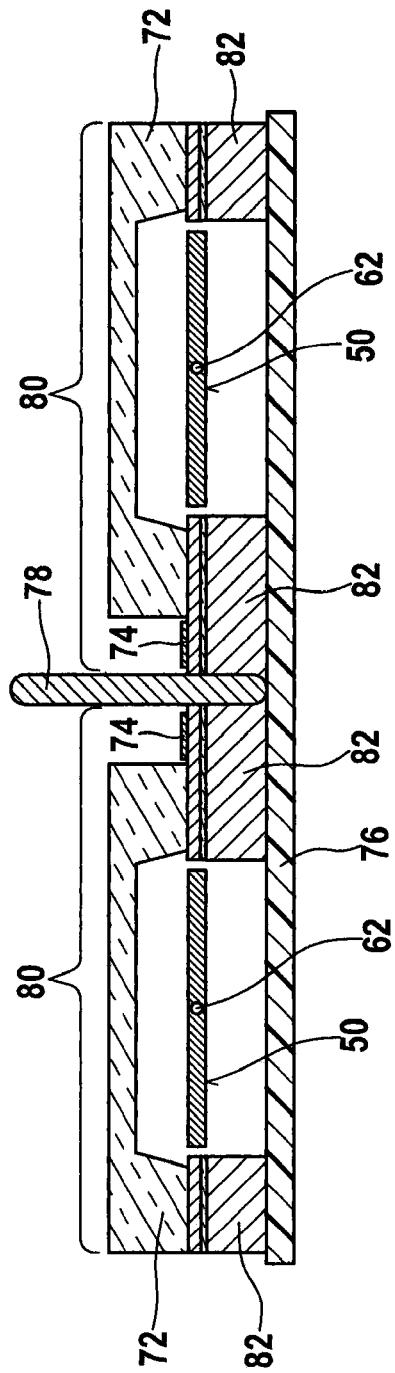
FIG. 3B shows a schematic illustration of a wafer to illustrate a first specific embodiment of the production method.

FIGS. 3A and 3B show schematic representations of a wafer to illustrate an embodiment of the production method according to the present invention.

In a first step of the method, a multitude of optically active surfaces 50 is formed on a wafer 52. For more clarity, only one optically active surface 50, which is developed as reflective surface, is shown in FIG. 3A.

Wafer 52 may at least partially consist of conductive material, such as (doped) silicon, and/or at least one metal, for example. In the illustrated example, wafer 52 includes a lower silicon layer 54, a center insulating layer 56, and an upper silicon layer 58. Center insulating layer 56 may be an oxide layer. For example, wafer 52 may be an SOI wafer (silicon-on-insulator).

The method described below is not restricted to an SOI wafer as starting material. Other known wafers may also be used to implement the production method.

If wafer 52 is an SOI wafer, then a multitude of cut-outs may be etched through upper silicon layer 58 so as to form the multitude of optically active surfaces 50. The regions of center insulating layer 56 exposed in this manner are subsequently removed. Then, separation trenches 60 are etched through lower silicon layer 54, so that each optically active surface 50 is connected to wafer 52 only via at least one spring element 62.

In an embodiment, each optically active surface 50 is able to be adjusted during a subsequent operation via a drive, for instance an electrostatic and/or magnetic drive. When structuring optically active surface 50 and the at least one spring element 62, it is also possible to form at least one subunit of the electrostatic and/or magnetic drive. Since the present invention is not restricted to a particular type of drive, the development of a drive will not be addressed here.

The present invention is not restricted to the production of an adjustable optically active surface 50. Consequently, the method described here may also be used to produce optically active surfaces 50 that are non-adjustable during the subsequent operation of the micromechanical component.

Once the structuring has been accomplished, a reflective coating may be applied to form optically active surface 50.

Because method steps for applying reflective coatings are known from the related art, they will not be discussed here. However, optically active surface 50 may also be formed by smoothing, planar etching and/or polishing.

In a second step of the production method, a cover wafer 68 is affixed on a rear side of wafer 52. The rear side of wafer 52 points in the opposite direction of optically active surface 50. Cover wafer 68 advantageously is a glass wafer. In this case cover wafer 68 is able to be mounted on lower silicon layer 54 of wafer 52 via anodic bonding. The material of cover wafer 68 need not necessarily be a light-transmitting material. For example, the material of cover wafer 68 is embossed glass and/or etched silicon.

In an embodiment, the second step of the production method may be implemented prior to the afore-described first step of the production method. The enumeration of the steps here does not stipulate a particular sequence for implementing the production method.

In an embodiment, regardless of the method sequence, cavities 66 lie under optically active surfaces 50. This ensures sufficient free space for adjusting optically active surface 50 with the aid of a drive. The size of each cavity 66 may be selected such that, in a later operation of the chip produced in the further course, a swing-out of optically active surface 50 from an initial position with the aid of a drive will not be hampered.

In an embodiment, cover wafer 68 may include separation trenches 70. They are either structured by etching or embossed. For example, separation trenches 70 subdivide cover wafer 68 into a multitude of protective caps 72, each of which covers a rear side of an optically active surface 50. This protects the rear side of each active surface 50 from decontamination.

In an embodiment, it is possible to apply further function-bearing layers, e.g., bond pads 74 for the electrical contacting of the drive for adjusting optically active surface 50, on the regions of lower silicon layer 54 exposed by separation trenches 70. For example, the possibility of applying function-bearing layers onto rear side of wafer 52 therefore remains, even after the rear side of optically active surface 50 has been covered.

The example result of the method steps described in the above paragraphs is shown in FIG. 3A. Optically active surface 50 is in a recessed position with respect to the front side and the rear side of wafer 52. As a result, for example, optically active surface 50 lies at a distance from the height of the outer surface of upper silicon layer 58. Wafer 52 is therefore easy to hold and process, optically active surface 50 being securely protected from direct contact.

In a further method step of an example embodiment, the front side of wafer 52 is covered by a sawing foil 76. Since optically active surface 50 is not disposed on an outer surface of one of the two silicon layers 54 and 58 in the exemplary embodiment shown, but instead is applied on the inner surface of lower silicon layer 54, sufficient clearance is ensured between sawing foil 76 and optically active surface 50. Optically active surface 50 is thus not contaminated or damaged by the application of sawing foil 76.

In an embodiment, sawing foil 76 and the multitude of protective caps 72 seal a multitude of interior spaces with optically active surfaces 50 in a dustproof manner. This avoids contamination of and/or damage to optically active surfaces 50 during the subsequently executed sawing operation.

The sawing operation is schematically illustrated in FIG. 3B. During the sawing operation, wafer 52 is subdivided into a multitude of individual chips 80 with the aid of a saw blade 78. Frame parts 82, which frame at least one optically active surface 50 in two dimensions, are formed from the material of wafer 52. If any linked regions still exist between individual protective caps 72, then they, too, may be separated during the sawing. The sawing through both wafers 52 and 68 is able to be implemented without intermediate relamination of wafers 52 and 68.

The regions having bond pads 74 are freely accessible during the sawing operation. During the subsequently or simultaneously implemented cleaning this offers the decisive advantage that occurring contamination from sawing is able to be removed without a trace. It is pointed out here once again that optically active surfaces 50 are unable to be contaminated or damaged by the particle dust produced during the sawing because of their shielding by sawing foil 76 and protective caps 72.

The subdivision of wafers 52 and/or 68 into individual chips 80 is carried out in such a way that each chip 80 has at least one optically active surface 50 and a protective cap 72. After separation and possibly undertaken cleaning of the outer sides of chips 80, each chip 80 may be held individually on its rear side, that is to say, at its protective cap 72, and be removed from sawing foil 76. For example, this can make it possible to insert each chip 80 into a housing. The production of a suitable housing and the insertion of chip 80 is discussed herein.

FIGS. 4A through 4E show schematic representations of a housing in order to illustrate an embodiment of the production method and apparatus.

Figure 4A:
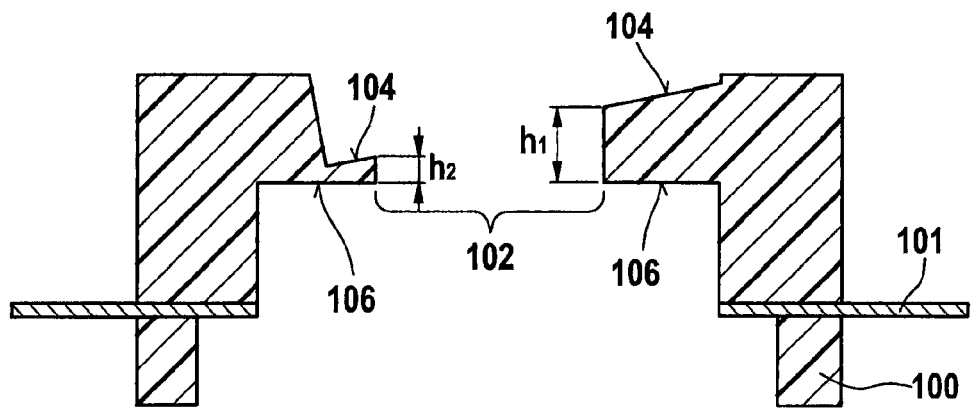
FIG. 4A shows a schematic illustration of a housing to illustrate a second specific embodiment of the production method.

Housing 100 schematically shown in FIG. 4A is able to be at least partially made of plastic. For example, housing 100 may be produced by an injection molding process. During the injection molding process connections 101 may be integrally cast in housing 100, which saves work.

Housing 100 has one side that includes a continuous opening 102. Outer contact surfaces 104 and inner contact surfaces 106 are formed on housing 100 adjacent to opening 102. Outer contact surfaces 104 frame continuous opening 102 on an outer side of housing 100. Inner contact surfaces 106 correspondingly frame continuous opening 102 on an inner side of housing 100.

Each region of outer contact surfaces 104 is separated from a region of inner contact surfaces 106 by a wall of housing 100. The wall of housing 100 situated between contact surfaces 104 and 106 is formed in such a way that outer contact surfaces 104 are aligned with respect to inner contact surfaces 106 at an angle of inclination not equal to 0° and not equal to 180°. In an embodiment, it is therefore possible to refer to outer contact surfaces 104 with their sloped design and inner contact surfaces 106 as drafts.

A frame is definable for continuous opening 102, which lies on the boundary surface of housing 100 adjacent to continuous opening 102. The frame has a maximum height h1 and a minimum height h2 not equal to maximum height h1. Contact surfaces 104 and 106 abut the frame.

Figure 4B:
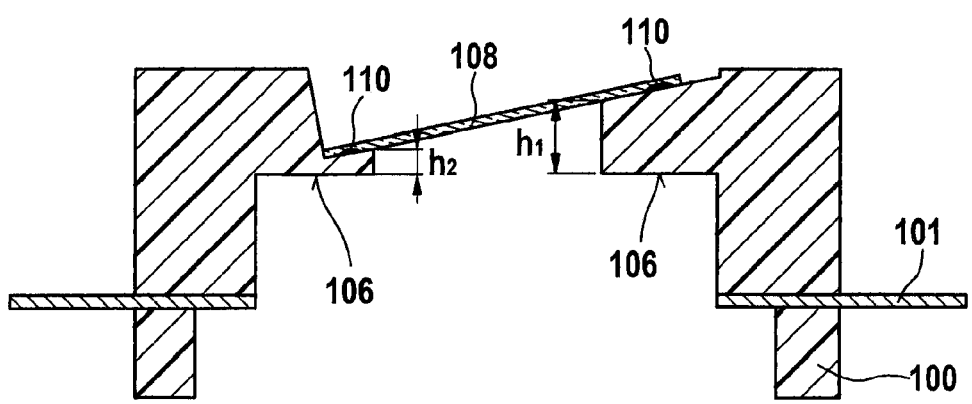
FIG. 4B shows a schematic illustration of a housing to illustrate a second specific embodiment of the production method.

An incident light window 108, which is at least partially made of a light-transmitting material, is able to be affixed on outer contact surfaces 104. For example, incident light window 108 is adhesion-bonded to outer contact surfaces 104 using an adhesive 110. FIG. 4B shows housing 100 following the installation of incident light window 108. Incident light window 108 is tiltingly aligned with respect to inner contact surfaces 106 at the previously already mentioned angle of inclination which is not equal to 0° and not equal to 180°. An inclined orientation of incident light window 108 may be understood to denote that a center plane of incident light window 108 is oriented at an incline with respect to inner contact surfaces 106.

In an example embodiment, incident light window 108 covers opening 102 completely. The light-transmitting material of incident light window 108 may have a refractive index not equal to 1. For example, the refractive index lies between 1.4 and 2.4. For example, incident light window 108 is made of glass. An incident light window 108 made of glass may be sawed out of a glass wafer with the aid of a standard process. Prior to the sawing of the glass wafer, for example, a sawing foil is applied on the glass wafer. Using screen printing, adhesive 110 is able to be applied on the glass wafer. This may take place prior to or following the sawing. Sawed incident light windows 108 are then able to be removed from the sawing foil and mounted on housing 100. Of course, a mounting process for affixing incident light window 108 on housing 100, in which the separation of incident light windows 108 takes place only after fixing incident light window 108 in place on outer contact surfaces 104, is provided.

In an example embodiment, the adhesive 110 seals opening 102 in a dustproof manner. This ensures reliable protection of the interior of housing 100 against contamination. For example, adhesive 110 is able to seal opening 102 in an airtight manner. In this case, the interior of housing 100 is reliably protected also from penetrating steam. If adhesive 110 is a reflow adhesive, then housing 100 and window 108 may be tempered jointly.

As an alternative to the installation, incident light window 108 may also be injection cast in opening 102. For example, because of different heights h1 and h2 of the framing of opening 102, an incident light window 108 having a minimum thickness and a maximum thickness not equal to the minimal thickness may be formed in such a case. The two boundary surfaces of incident light window 108 are then formed at an incline with respect to each other. Given a sufficiently large angle of inclination of the two boundary surfaces with respect to each other, it is possible to dispense with a slanted design of contact surfaces 104 and 106.

Figure 4C:
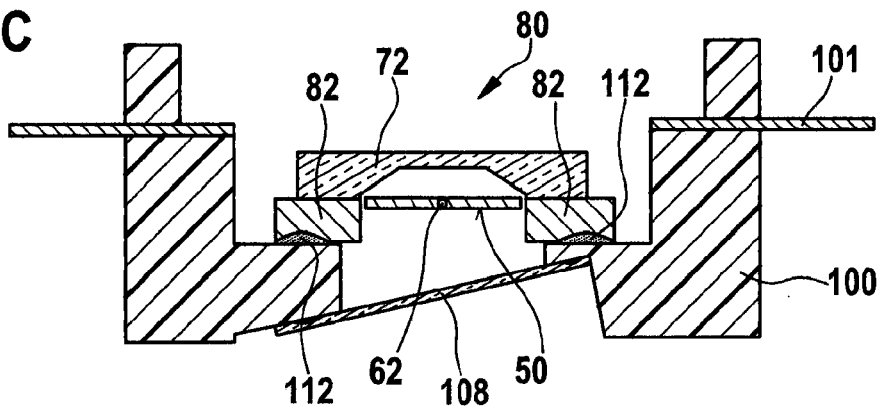
FIG. 4C shows a schematic illustration of a housing to illustrate a second specific embodiment of the production method.

Subsequently, in an embodiment, a chip 80 is installed in housing 100, as shown in FIG. 4C. Chip 80 is affixed on inner contact surfaces 106. For example, an adhesive 112 is used to bond chip 80 to inner contact surfaces 106.

In an embodiment, chip 80 is able to be produced with the aid of the afore-described production method. Chip 80 includes at least one optically active surface 50. In an embodiment, chip 80 has a protective cap 72, which protects the interior of chip 80 against contamination and/or damage from a rear side facing away from optically active surface 50. Frame part 82 of chip 80 is fixed in place on inner contact surfaces 106 in such a way that optically active surface 50 is pointing toward incident light window 108 and protective cap 72 is pointing in the opposite direction of incident light window 108.

In an embodiment, at least in a deactivated operating mode of chip 80, optically active surface 50 of chip 80 is in an initial position with respect to frame part 82 and protective cap 72.

In an embodiment, in an active operating mode of chip 80, optically active surface 50 is able to be adjusted from the initial position into at least one other position via a drive, for instance an electrostatic and/or magnetic drive. The initial position is therefore understood as the position of optically active surface 50 from which it is adjustable only via an operation of the drive. If the current flow to the drive is switched off, for example, then optically active surface 50 is in its initial position.

For example, chip 80 is fixed in place on inner contact surfaces 50 in such a way that the initial position of optically active surface 50, for example, in the case of a deactivated chip 80, is aligned at an incline with respect to incident light window 108, the angle of inclination being not equal to 0° and not equal to 180°. Consequently, the angle of inclination is not equal to 0° and not equal to 180° between optically active surface 50 and a center plane of incident light window 108. A corresponding angle of inclination not equal to 0° and not equal to 180° may also exist with respect to at least one boundary surface of incident light window 108.

Because of the angle of inclination not equal to 0° and not equal to 180° between optically active surface 50 and incident light window 108, a beam of light impinging on incident light window 108 will be reflected away from an image plane of optically active surface 50 at the boundary surfaces of incident light window 108. This prevents the occurrence of an interference reflex on an image produced by an operation of optically active surface 50.

Figure 4D:
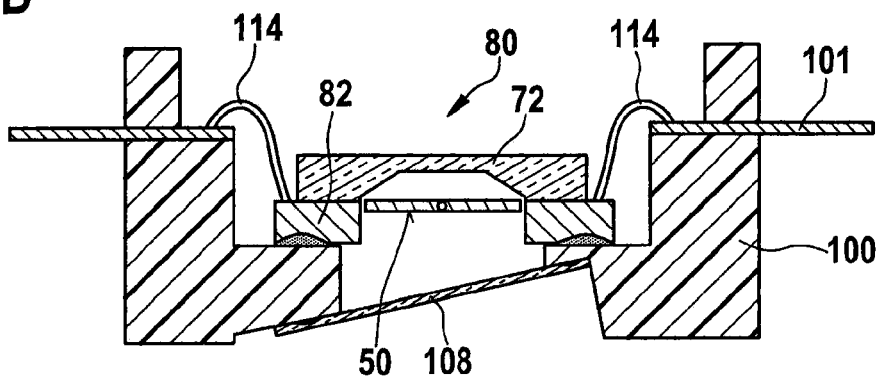
FIG. 4D shows a schematic illustration of a housing to illustrate a second specific embodiment of the production method.

FIG. 4D shows an example housing 100 including chip 80 after an electrical contacting with wire bonds 114 has been established. Wire bonds 114 connect the bond pads (not shown) of chip 80 with connections 101.

Figure 4E:
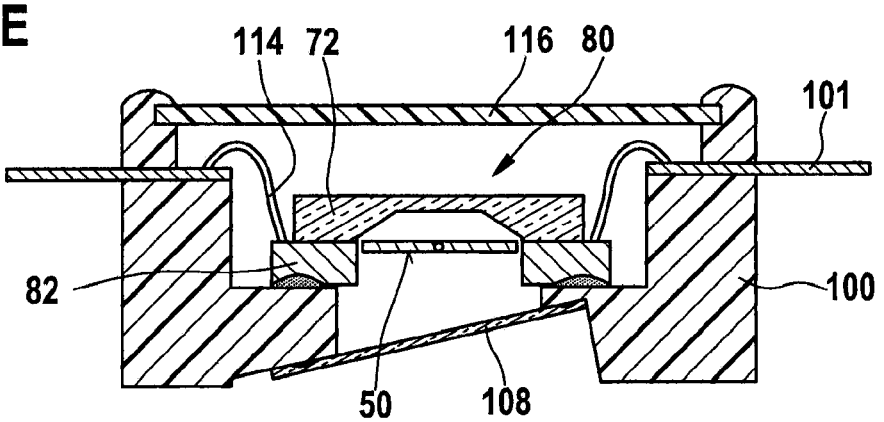
FIG. 4E shows a schematic illustration of a housing to illustrate a second specific embodiment of the production method.

In an embodiment, in a further method step, shown in FIG. 4E, a housing lid 116 is mounted on housing 100. Housing lid 116 preferably seals housing 100 in a dustproof manner. In an embodiment, because of the aforementioned advantages, an airtight sealing of housing 100 is provided. Housing lid 116 may be produced by an injection molding process, for example. Housing lid 116 is also able to be produced as embossed metal element. Connections 101 may then be bent into a desired form.

Figure 5:
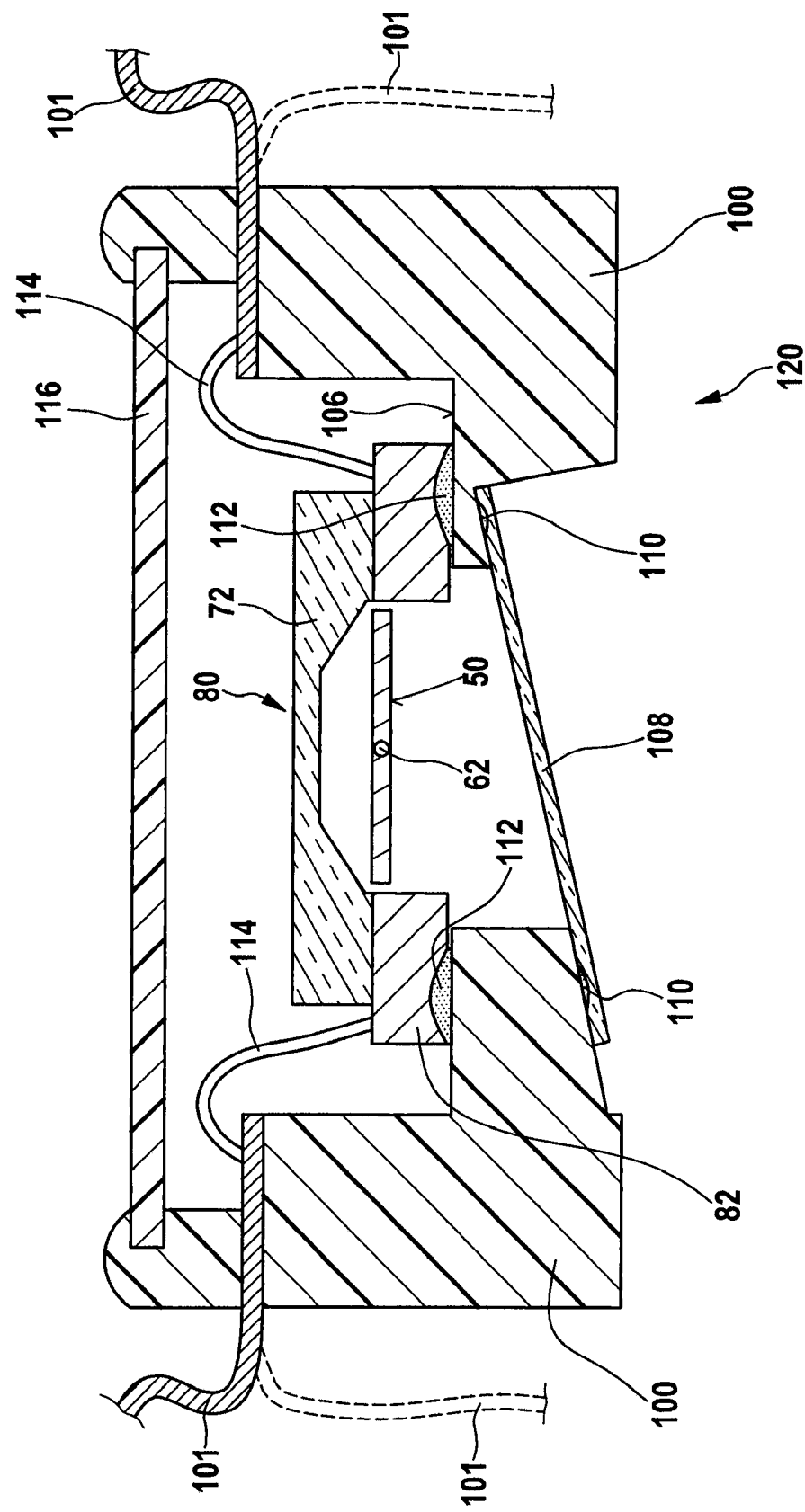
FIG. 5 shows a schematic illustration of a first specific development of the micromechanical component.

FIG. 5 shows a schematic illustration of a first specific development of the micromechanical component.

Illustrated micromechanical component 120 includes chip 80, described earlier, and housing 100 having components 101 through 116. Micromechanical component 120 is able to be produced in a cost-effective manner using the production method described above with the aid of FIGS. 3A and 3B and 4A through 4E. For example, a production of micromechanical component 120 by standardized method steps is possible. It is then ensured that optically active surface 50 is reliably protected against contamination and/or damage during the separation of chip 80.

In an embodiment, in a deactivated state of chip 80, optically active surface 50 in micromechanical component 120 is in an initial position, in which it is situated at an incline with respect to incident light window 108, the angle of inclination being not equal to 0° and not equal to 180°. This prevents that a beam of light impinging on incident light window 108 is reflected into an image plane of optically active surface 50 and leads to interference reflexes there. This helps to improve the quality of the image produced with the aid of micromechanical component 120.

In micromechanical component 120, incident light window 108 is aligned at an incline with respect to housing lid 116. In an embodiment, as an alternative, the inner contact surfaces 106 can be formed in such a way that they are aligned at an incline with respect to housing lid 116, which is inserted subsequently. In this case, for example, incident light window 108 may be disposed parallel to housing lid 116. The occurrence of interference reflexes in the image plane of optically active surface 50 is prevented in such a micromechanical component 120.

Figure 6:
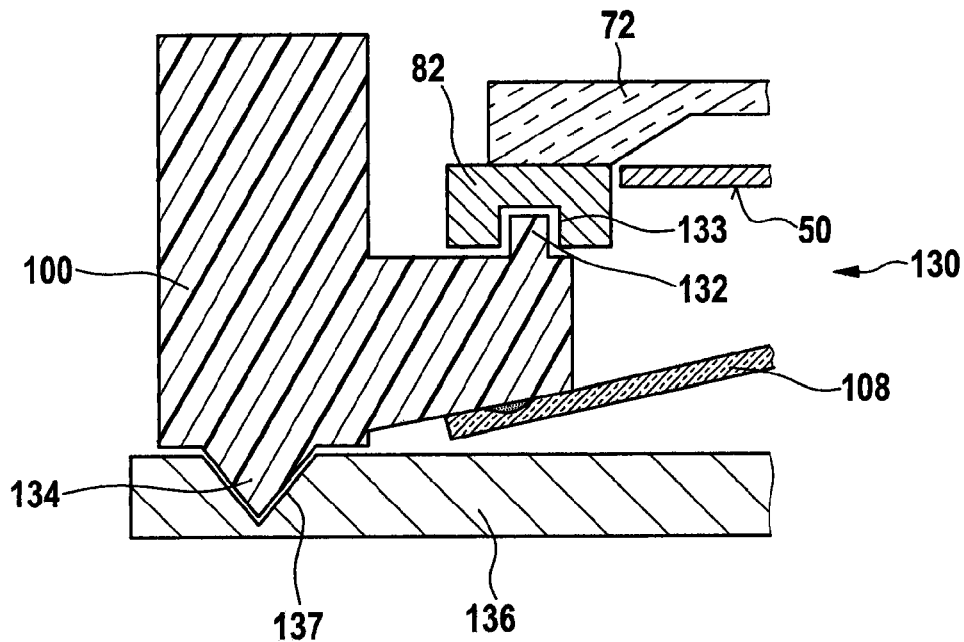
FIG. 6 shows a schematic illustration of a part of a second specific development of the micromechanical component.

FIG. 6 shows a schematic illustration of a part of a second development of the micromechanical component.

Schematically reproduced micromechanical component 130 includes already described chip 80 and housing 100 having components 101 through 116. Chip 80 is situated inside housing 100 in such a way that optically active surface 50 of chip 80 in its initial position is inclined at an angle of inclination with respect to incident light window 108. The definition of the initial position reference is described herein.

As addition to the afore-described component of FIG. 5, micromechanical component 130 has adjustment elements 132, 133 and 134, which facilitate the adjustment of chip 80 inside housing 100 and the adjustment of micromechanical component 130 on a mounting board 136 via an adjustment element 137 of the mounting board. For example, adjustment elements 132, 133 and 134 ensure that the positions of chip 80 and micromechanical component 130 relative to mounting board 136 are observed. Since an imprecise adjustment of chip 80 inside housing 100 and/or micromechanical component 130 on mounting board 136 normally has a significant detrimental effect on the operability of the system, adjustment elements 132, 133, 134 and 137 also improve the operability of the system.

For example, a first adjustment element 132 is a conical projection on inner contact surface 104. A cut-out which corresponds to first adjustment element 132 is developed as second adjustment element 133 at a suitable location on frame part 82 of chip 80. Adjustment elements 132 and 133 ensure that chip 80 is easily adjustable in a preferred position in the interior of housing 100. For example, adjustment elements 132 and 133 enable a self-adjustment of chip 80 inside housing 100.

A pyramid-shaped projection is developed as third adjustment element 134 on an outer wall of housing 100. A cut-out 137 corresponding to pyramid-shaped projection used as adjustment element 134 is present on mounting board 136. Mounting board 136 may be, for instance, a printed circuit board (PCB). Conical adjustment element 134 and associated cut-out 137 facilitate the placement of micromechanical component 130 in a desired position relative to mounting board 136.

Figure 7:
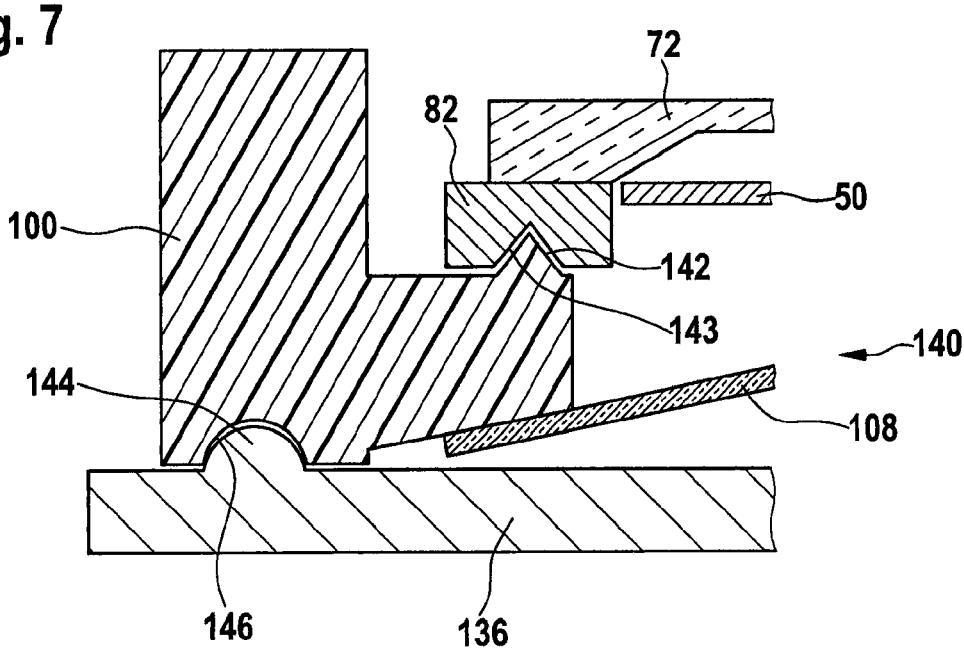
FIG. 7 shows a schematic illustration of a part of a third specific embodiment of the micromechanical component.

FIG. 7 shows a schematic illustration of a part of an embodiment of the development of the micromechanical component.

Components 80 and 100 through 116 of micromechanical component 140 have already been described earlier. It has likewise already been discussed in greater detail that optically active surface 50 of chip 80 in its initial position is inclined at an angle of inclination with respect to incident light window 108.

In an embodiment, micromechanical component 140, as well, includes adjustment elements 142, 143 and 144. First adjustment element 142 is a pyramid-shaped projection for which a corresponding cut-out is formed as second adjustment element 143 in frame part 82 of chip 80. This ensures a simple adjustment of chip 80 in a position within housing 100.

In an embodiment, third adjustment element 144 of micromechanical component 140 is a semispherical cut-out. A corresponding semispherical projection is formed on mounting board 136. Second adjustment element 144 and precisely fitting semispherical projection 146 of mounting board 136 ensure that micromechanical component 140 is easily adjustable in the desired position with respect to mounting board 136.

Conical, semispherical and/or pyramid-shaped projections on housing 100, frame part 82 and/or on mounting board 136 may be formed as adjustment elements 132, 133, 134, 142, 143 and 144. In the same way, in an embodiment, corresponding cut-outs can be formed, into which the conical, semispherical and/or pyramid-shaped projections may be placed, on housing 100, frame part 82 of chip 80, and/or mounting board 136. In an embodiment, the corresponding cut-outs are formed so as to have a precise fit with the conical, semispherical and/or pyramid-shaped projections.

In an embodiment, the projections and cut-outs are designed such that a self-adjustment of chip 80 within housing 100 and/or a self-adjustment of micromechanical component 130 or 140 on mounting board 136 is possible. The self-adjustment may take place in all three spatial directions. This in particular facilitates the direct adjustment of chip 80 relative to mounting board 136.

Micromechanical components 120, 130 or 140 described in the above paragraphs are able to be used, for instance, in a head-up display, in the motor vehicle field or in a mini-projector in the consumer field. Use of micromechanical components 120, 130 or 140 as switches in optical networks (optical cross connect) or in a surface scanner is also conceivable.

What is claimed is:

1. A production method for a micromechanical component, comprising:
    forming a housing having a wall with a continuous opening, a first contact surface and a second contact surface being situated on opposed sides of the wall, and an incident light window being attached to the first contact surface;
    forming a multitude of optically active surfaces on a wafer;
    subdividing the wafer into a multitude of chips having at least one optically active surface in each case, which is designed such that at least in a deactivated operating mode of each chip, the optically active surface is disposed in an initial position with respect to each chip; and mounting at least one of the chips to the second contact surface of the wall of the housing, the optically active surface of each chip in its initial position being aligned with respect to the incident light window at an angle of inclination that is not equal to 0° and not equal to 180°.

2. The production method as recited in claim 1, wherein the optically active surface is formed in recessed manner with respect to an equidirectional front side of the wafer.

3. The production method as recited in claim 1, wherein, prior to subdividing the wafer, a cover wafer is fixed in place on a rear side of the wafer oriented counter to the optically active surface, the cover wafer being subdivided into a multitude of protective caps, so that each chip has a protective cap.

4. The production method as recited in claim 1, wherein, prior to subdividing the wafer, the front side of the wafer having the same direction as the optically active surface is covered by a sawing foil.

5. The production method as recited in claim 1, wherein a first adjustment element is developed on an outer side of the housing, and a precisely fitting second adjustment element is developed on a mounting board, the first adjustment element and the second adjustment element being brought into contact with each other such that they establish a mechanical connection between the housing and the mounting board.

6. A micromechanical component, comprising:
a chip including an optically active surface, the optically active surface being situated, at least in a deactivated operating mode of the chip, in an initial position with respect to the chip; and
a housing having a wall with a continuous opening, a first contact surface and a second contact surface being situated on opposed sides of the wall, the housing completely surrounding the chip and having an incident light window attached to the first contact surface; the chip being affixed to the second contact surface of the wall of the housing such that the optically active surface in its initial position has an inclined alignment with respect to the incident light window, the angle of inclination being not equal to 0° and not equal to 180°.

7. The micromechanical component as recited in claim 6, wherein the micromechanical component includes a drive by which, in an activated operating mode of the chip, the at least one optically active surface is able to be adjusted from the initial position into at least one additional position with respect to the chip.

8. The micromechanical component as recited in claim 6, wherein the incident light window covers the opening at least partially, the second contact surface being aligned with respect to the first contact surface at an angle of inclination that is not equal to 0° and not equal to 180°.

9. The micromechanical component as recited in claim 6, wherein the housing has a first adjustment element, and the chip has a precisely fitting second adjustment element, and the chip is affixed inside the housing such that the first adjustment element and the second adjustment element establish a mechanical connection between the chip and the housing.

10. The micromechanical component as recited in claim 9, wherein at least one of the first adjustment element and the second adjustment element, may include at least one of a conical, semispherical and pyramid-shaped projection, the first adjustment element and/or the second adjustment element including a cut-out that is a precise fit with the conical, semispherical and/or pyramid-shaped projection.

* * * * *